United States Patent
Cardona et al.

(10) Patent No.: US 12,119,805 B2
(45) Date of Patent: Oct. 15, 2024

(54) SUBSTRATE PROCESSING AND MEMBRANE RELEASE OF TRANSVERSELY-EXCITED FILM BULK ACOUSTIC RESONATOR USING A SACRIFICIAL TUB

(71) Applicant: Murata Manufacturing Co., Ltd., Nagaokakyo (JP)

(72) Inventors: Albert Cardona, Santa Barbara, CA (US); Douglas Jachowski, Santa Cruz, CA (US); Chris O'Brien, San Diego, CA (US)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 489 days.

(21) Appl. No.: 17/548,234

(22) Filed: Dec. 10, 2021

(65) Prior Publication Data

US 2022/0103154 A1    Mar. 31, 2022

Related U.S. Application Data

(63) Continuation-in-part of application No. 17/081,692, filed on Oct. 27, 2020, now Pat. No. 11,349,450,
(Continued)

(51) Int. Cl.
*H03H 9/02*     (2006.01)
*H03H 3/04*     (2006.01)
(Continued)

(52) U.S. Cl.
CPC .......... *H03H 9/02228* (2013.01); *H03H 3/04* (2013.01); *H03H 9/02031* (2013.01);
(Continued)

(58) Field of Classification Search
CPC .. H03H 9/02228; H03H 3/04; H03H 9/02031; H03H 9/132; H03H 9/174;
(Continued)

(56) References Cited

U.S. PATENT DOCUMENTS 5,274,345 A    12/1993   Gau
5,446,330 A    8/1995    Eda et al.
(Continued)

FOREIGN PATENT DOCUMENTS

CN     113765495 A    12/2021
JP     2002300003 A    10/2002
(Continued)

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
(Continued)

Primary Examiner — Hafizur Rahman
(74) Attorney, Agent, or Firm — ARENTFOX SCHIFF LLP

(57) ABSTRACT

An acoustic resonator device is formed using a sacrificial layer and a front side etched cavity by forming a recess in a silicon substrate with a trap-rich top layer and filling the recess with sacrificial silicon nitride. A bonding oxide (BOX) layer is formed over the trap-rich layer and the sacrificial silicon nitride filled recess and a piezoelectric plate is bonded to the BOX layer. The sacrificial silicon nitride is then removed to form a cavity by using an etchant introduced through holes in the piezoelectric plate and BOX layer without removing the BOX layer from over the cavity.

20 Claims, 9 Drawing Sheets

Related U.S. Application Data which is a continuation-in-part of application No. 16/920,173, filed on Jul. 2, 2020, now Pat. No. 11,139,794, which is a continuation of application No. 16/438,121, filed on Jun. 11, 2019, now Pat. No. 10,756,697, which is a continuation-in-part of application No. 16/230,443, filed on Dec. 21, 2018, now Pat. No. 10,491,192.

(60) Provisional application No. 63/130,064, filed on Dec. 23, 2020, provisional application No. 63/045,916, filed on Jun. 30, 2020, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
  *H03H 9/13* (2006.01)
  *H03H 9/17* (2006.01)
  *H03H 9/56* (2006.01)
  *H03H 3/02* (2006.01)

(52) U.S. Cl.
  CPC ............ *H03H 9/132* (2013.01); *H03H 9/174* (2013.01); *H03H 9/176* (2013.01); *H03H 9/562* (2013.01); *H03H 9/564* (2013.01); *H03H 9/568* (2013.01); *H03H 2003/023* (2013.01); *H03H 2003/0442* (2013.01)

(58) Field of Classification Search
  CPC ........ H03H 9/176; H03H 9/562; H03H 9/564; H03H 9/568; H03H 2003/023; H03H 2003/0442
  USPC ........................................................ 333/192
  See application file for complete search history.

(56) References Cited

U.S. PATENT DOCUMENTS

| | | | |
|---|---|---|---|
| 5,552,655 A | 9/1996 | Stokes et al. | |
| 5,726,610 A | 3/1998 | Allen et al. | |
| 5,853,601 A | 12/1998 | Krishaswamy | |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,570,470 B2 | 5/2003 | Maehara et al. | |
| 6,707,229 B1 | 3/2004 | Martin | |
| 6,710,514 B2 | 3/2004 | Ikada et al. | |
| 6,833,774 B2 | 12/2004 | Abbott et al. | |
| 7,042,132 B2 | 5/2006 | Bauer et al. | |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,939,987 B1 | 5/2011 | Solal et al. | |
| 7,941,103 B2 | 5/2011 | Iwamoto et al. | |
| 7,965,015 B2 | 6/2011 | Tai et al. | |
| 8,278,802 B1 | 10/2012 | Lee et al. | |
| 8,294,330 B1 | 10/2012 | Abbott et al. | |
| 8,344,815 B2 | 1/2013 | Yamanaka et al. | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2* | 8/2015 | Takahashi | H10N 30/87 |
| 9,130,145 B2 | 9/2015 | Martin et al. | |
| 9,148,121 B2 | 9/2015 | Inoue | |
| 9,219,466 B2 | 12/2015 | Meltaus et al. | |
| 9,240,768 B2 | 1/2016 | Nishihara et al. | |
| 9,276,557 B1 | 3/2016 | Nordquist et al. | |
| 9,369,105 B1 | 6/2016 | Li et al. | |
| 9,425,765 B2 | 8/2016 | Rinaldi | |
| 9,525,398 B1 | 12/2016 | Olsson | |
| 9,564,873 B2 | 2/2017 | Kadota | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,812,048 B2 | 10/2020 | Nosaka | |
| 10,819,309 B1 | 10/2020 | Turner et al. | |
| 10,826,462 B2 | 11/2020 | Plesski et al. | |
| 10,868,510 B2* | 12/2020 | Yantchev | H03H 9/175 |
| 10,868,512 B2 | 12/2020 | Garcia et al. | |
| 10,868,513 B2 | 12/2020 | Yantchev | |
| 10,911,017 B2 | 2/2021 | Plesski | |
| 10,911,021 B2 | 2/2021 | Turner et al. | |
| 10,911,023 B2 | 2/2021 | Turner | |
| 10,917,070 B2 | 2/2021 | Plesski et al. | |
| 10,917,072 B2 | 2/2021 | McHugh et al. | |
| 10,985,726 B2 | 4/2021 | Plesski | |
| 10,985,728 B2 | 4/2021 | Plesski et al. | |
| 10,985,730 B2 | 4/2021 | Garcia | |
| 10,992,282 B1 | 4/2021 | Plesski et al. | |
| 10,992,283 B2 | 4/2021 | Plesski et al. | |
| 10,992,284 B2 | 4/2021 | Yantchev | |
| 10,998,877 B2 | 5/2021 | Turner et al. | |
| 10,998,882 B2 | 5/2021 | Yantchev et al. | |
| 11,003,971 B2 | 5/2021 | Plesski et al. | |
| 11,114,996 B2 | 9/2021 | Plesski et al. | |
| 11,114,998 B2 | 9/2021 | Garcia et al. | |
| 11,139,794 B2 | 10/2021 | Plesski et al. | |
| 11,143,561 B2 | 10/2021 | Plesski | |
| 11,146,231 B2 | 10/2021 | Plesski | |
| 11,146,232 B2 | 10/2021 | Yandrapalli et al. | |
| 11,146,238 B2 | 10/2021 | Hammond et al. | |
| 11,146,244 B2 | 10/2021 | Yantchev | |
| 11,165,407 B2 | 11/2021 | Yantchev | |
| 11,171,629 B2 | 11/2021 | Turner | |
| 11,201,601 B2 | 12/2021 | Yantchev et al. | |
| 11,418,167 B2 | 8/2022 | Garcia | |
| 11,981,559 B2* | 5/2024 | Cok | H10N 30/88 |
| 2002/0079986 A1 | 6/2002 | Ruby et al. | |
| 2002/0130736 A1 | 9/2002 | Mukai | |
| 2002/0158714 A1 | 10/2002 | Kaitila et al. | |
| 2002/0189062 A1 | 12/2002 | Lin et al. | |
| 2003/0080831 A1 | 5/2003 | Naumenko et al. | |
| 2003/0199105 A1 | 10/2003 | Kub et al. | |
| 2004/0041496 A1 | 3/2004 | Imai et al. | |
| 2004/0100164 A1 | 5/2004 | Murata | |
| 2004/0261250 A1 | 12/2004 | Kadota et al. | |
| 2005/0099091 A1 | 5/2005 | Mishima et al. | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0152107 A1 | 7/2006 | Tanaka | |
| 2006/0179642 A1 | 8/2006 | Kawamura | |
| 2007/0090898 A1 | 4/2007 | Kando | |
| 2007/0115079 A1 | 5/2007 | Kubo et al. | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2007/0296304 A1 | 12/2007 | Fujii et al. | |

(56) References Cited

U.S. PATENT DOCUMENTS

| | | |
|---|---|---|
| 2008/0246559 A1 | 10/2008 | Ayazi |
| 2010/0019866 A1 | 1/2010 | Hara et al. |
| 2010/0064492 A1 | 3/2010 | Tanaka |
| 2010/0123367 A1 | 5/2010 | Tai et al. |
| 2010/0212127 A1 | 8/2010 | Heinze et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto et al. |
| 2011/0278993 A1 | 11/2011 | Iwamoto |
| 2012/0286900 A1 | 11/2012 | Kadota et al. |
| 2012/0326809 A1 | 12/2012 | Tsuda |
| 2013/0057360 A1 | 3/2013 | Meltaus et al. |
| 2013/0127551 A1 | 5/2013 | Yamanaka |
| 2013/0207747 A1 | 8/2013 | Nishii et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0113571 A1 | 4/2014 | Fujiwara et al. |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0312994 A1 | 10/2014 | Meltaus et al. |
| 2015/0042417 A1 | 2/2015 | Onodera et al. |
| 2015/0165479 A1 | 6/2015 | Lasiter et al. |
| 2015/0244149 A1 | 8/2015 | Van Someren |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0036415 A1 | 2/2016 | Ikeuchi |
| 2016/0079958 A1 | 3/2016 | Burak |
| 2016/0087187 A1 | 3/2016 | Burak |
| 2016/0149554 A1 | 5/2016 | Nakagawa |
| 2016/0182009 A1 | 6/2016 | Bhattacharjee |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0187352 A1 | 6/2017 | Omura |
| 2017/0201232 A1 | 7/2017 | Nakamura et al. |
| 2017/0214381 A1 | 7/2017 | Bhattacharjee |
| 2017/0214387 A1 | 7/2017 | Burak et al. |
| 2017/0214389 A1 | 7/2017 | Tsutsumi |
| 2017/0222617 A1 | 8/2017 | Mizoguchi |
| 2017/0222622 A1 | 8/2017 | Solal et al. |
| 2017/0264266 A1 | 9/2017 | Kishimoto |
| 2017/0290160 A1 | 10/2017 | Takano et al. |
| 2017/0359050 A1 | 12/2017 | Irieda et al. |
| 2017/0370791 A1 | 12/2017 | Nakamura et al. |
| 2018/0005950 A1 | 1/2018 | Watanabe |
| 2018/0013400 A1 | 1/2018 | Ito et al. |
| 2018/0013405 A1 | 1/2018 | Takata |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0152169 A1 | 5/2018 | Goto et al. |
| 2018/0191322 A1 | 7/2018 | Chang et al. |
| 2018/0212589 A1 | 7/2018 | Meltaus et al. |
| 2018/0278227 A1 | 9/2018 | Hurwitz |
| 2018/0316333 A1 | 11/2018 | Nakamura et al. |
| 2018/0358948 A1* | 12/2018 | Gong ............... H03H 9/02157 |
| 2019/0007022 A1 | 1/2019 | Goto et al. |
| 2019/0068155 A1 | 2/2019 | Kimura et al. |
| 2019/0068164 A1 | 2/2019 | Houlden et al. |
| 2019/0123721 A1 | 4/2019 | Takamine |
| 2019/0131953 A1* | 5/2019 | Gong ............... H03H 9/14555 |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Kimura et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0235719 A1 | 7/2020 | Yantchev et al. |
| 2020/0259480 A1* | 8/2020 | Pensala ............. H03H 9/02228 |
| 2020/0295729 A1* | 9/2020 | Yantchev ............... H03H 9/174 |
| 2020/0304091 A1 | 9/2020 | Yantchev |
| 2020/0313645 A1 | 10/2020 | Caron |
| 2020/0321939 A1 | 10/2020 | Turner et al. |
| 2020/0328728 A1 | 10/2020 | Nakagawa et al. |
| 2020/0350891 A1* | 11/2020 | Turner ................. H03H 9/132 |
| 2020/0373907 A1 | 11/2020 | Garcia |
| 2021/0013859 A1 | 1/2021 | Turner et al. |
| 2021/0273631 A1 | 9/2021 | Jachowski et al. |
| 2021/0313951 A1 | 10/2021 | Yandrapalli et al. |
| 2021/0328574 A1 | 10/2021 | Garcia |
| 2022/0103160 A1 | 3/2022 | Jachowski et al. |
| 2022/0116015 A1 | 4/2022 | Garcia et al. |
| 2022/0123720 A1 | 4/2022 | Garcia et al. |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | |
|---|---|---|
| JP | 2004096677 A | 3/2004 |
| JP | 2004523179 A | 7/2004 |
| JP | 2007329584 A | 12/2007 |
| JP | 2010062816 A | 3/2010 |
| JP | 2010103803 A | 5/2010 |
| JP | 2010154505 A | 7/2010 |
| JP | 2013528996 A | 7/2013 |
| JP | 2013214954 A | 10/2013 |
| JP | 2017526254 A | 9/2017 |
| JP | 2017220910 A | 12/2017 |
| JP | 2018093487 A | 6/2018 |
| JP | 2018166259 A | 10/2018 |
| JP | 2018207144 A | 12/2018 |
| JP | 2019186655 A | 10/2019 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2016017104 | 2/2016 |
| WO | 2016052129 A1 | 4/2016 |
| WO | 2017188342 A1 | 11/2017 |
| WO | 2018003268 A1 | 1/2018 |
| WO | 2018003273 | 1/2018 |
| WO | 2018163860 A1 | 9/2018 |
| WO | 2019117133 A1 | 6/2019 |
| WO | 2019138810 A1 | 7/2019 |
| WO | 2020092414 A2 | 5/2020 |
| WO | 2020100744 A1 | 5/2020 |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Buchanan "Ceramic Materials for Electronics" 3rd Edition, first published in 2004 by Marcel Dekker, Inc. pp. 496 (Year 2004). Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

(56) References Cited

OTHER PUBLICATIONS

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Material Properties of Tibtech Innovations, © 2018 TIBTECH Innovations (Year 2018). 2018.
Merriam Webster, dictionary meaning of the word "diaphragm", since 1828, Merriam Webster (Year: 1828) 1828.
Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja. 4410690406.
Moussa et al. Review on Triggered Liposomal Drug Delivery with a Focus on Ultrasound 2015, Bentham Science Publishers, pp. 16 (Year 2005) 2005.
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Naumenko et al., "Optimal orientations of Lithium Niobate for resonator SAW filters", 2003 IEEE Ultrasonics Symposium—pp. 2110-2113. (Year: 2003).
R. Olsson III, K. Hattar et al. "A high electromechanical coupling coefficient SHO Lamb wave lithiumniobate micromechanical resonator and a method for fabrication" Sensors and Actuators A: Physical, vol. 209, Mar. 1, 2014, pp. 183-190.
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
Safari et al. "Piezoelectric for Transducer Applications" published by Elsevier Science Ltd., pp. 4 (Year: 2000). 2020.
Santosh, G. , Surface acoustic wave devices on silicon using patterned and thin film ZnO, Ph.D. thesis, Feb. 2016, Indian Institute of technology Guwahati, Assam, India Feb. 2016.
Sorokin et al.Study of Microwave Acoustic Attenuation in a Multifrequency Bulk Acoustic Resonator Based on a Synthetic Diamond Single CrystalPublished in Acoustical Physics, vol. 61, No. 6, 2015 pp. 675 (Year 2015) Jan. 2015.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
USPTO/ISA, International Search Report and Written Opinion for PCT Application No. PCT/US2020/45654 dated Oct. 29, 2020.
USPTO/ISA, International Search Report and Written Opinion for PCT Application No. PCT/US2021/024824 dated Jul. 27, 2021, 9 total pages.
USPTO/ISA, International Search Report and Written Opinion for PCT Application No. PCT/US2021/048505 dated Dec. 1, 2021, 11 total pages.
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
Zou, Jie "High-Performance Aluminum Nitride Lamb Wave Resonators for RF Front-End Technology" University of California, Berkeley, Summer 2015, pp. 63 (Year 2015) Jan. 2015.
Chen et al., "Development and Application of SAW Filter," Micromachines, Apr. 20, 2022, vol. 13, No. 656, pp. 1-15.
Hermann et al., "Properties of shear-horizontal surface acoustic waves in different layered quartz-SiO2 structures," Ultrasonics, 1999, vol. 37, pp. 335-341.
Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.pages.

\* cited by examiner

FIG. 6B

SUBSTRATE PROCESSING AND MEMBRANE RELEASE OF TRANSVERSELY-EXCITED FILM BULK ACOUSTIC RESONATOR USING A SACRIFICIAL TUB

RELATED APPLICATION INFORMATION

This patent claims priority to U.S. provisional patent application 63/130,064, filed Dec. 23, 2020, entitled SXBAR SUBSTRATE PROCESSING AND MEMBRANE RELEASE, all of which is incorporated herein by reference.

This patent is a continuation-in-part of and claims the priority benefit from application Ser. No. 17/081,692, filed Oct. 27, 2020, titled SYMMETRIC TRANSVERSELY-EXCITED FILM BULK ACOUSTIC RESONATORS WITH REDUCED SPURIOUS MODES, which claims priority from provisional patent application 63/045,916, filed Jun. 30, 2020, entitled SYMMETRIC XBAR TOPOLOGIES FOR SPUR CONTROL; is a continuation-in-part of application Ser. No. 16/920,173, entitled TRANSVERSELY-EXCITED FILM BULK ACOUSTIC RESONATOR, filed Jul. 2, 2020, which is a continuation of application Ser. No. 16/438,121, entitled TRANSVERSELY-EXCITED FILM BULK ACOUSTIC RESONATOR, filed Jun. 11, 2019, now U.S. Pat. No. 10,756,697, which is a continuation-in-part of application Ser. No. 16/230,443, entitled TRANSVERSELY-EXCITED FILM BULK ACOUSTIC RESONATOR, filed Dec. 21, 2018, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All these applications are incorporated herein by reference.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP (3$^{rd}$ Generation Partnership Project). Radio access technology for 5$^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in patent U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIGS. 6A, 6B and 6C (collectively "FIG. 6") are a flow chart of a process for fabricating an XB AR using a sacrificial tub, front side etched cavities and front-side membrane release.

Figure 1:
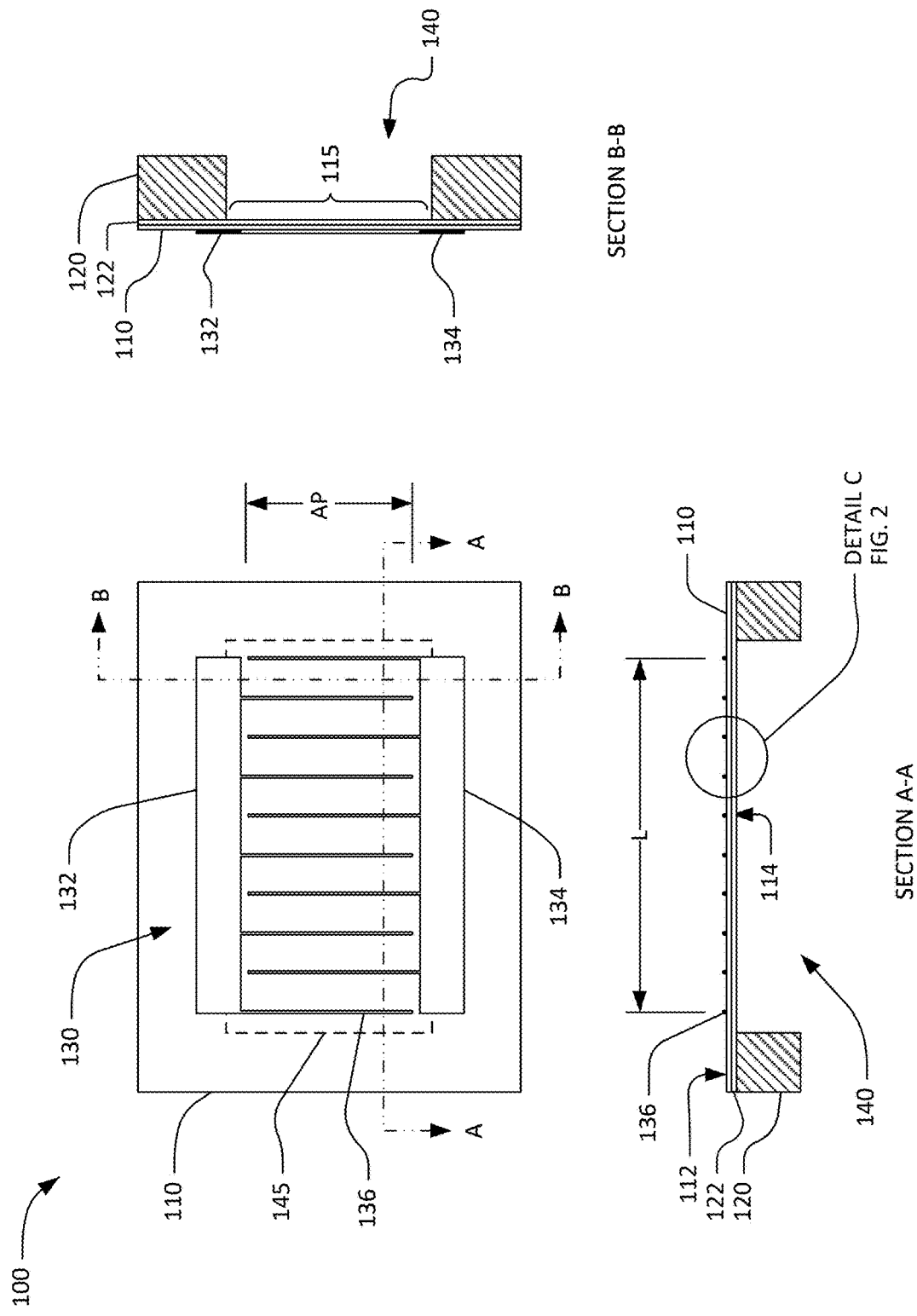
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Transversely-Excited Film Bulk Acoustic Resonator (XBAR) is a new resonator structure for use in microwave filters. The XBAR is described in patent U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include the front-side and/or back-side dielectric layers. An XBAR resonator may be such a diaphragm or membrane with an interdigital transducer (IDT) formed on a diaphragm or membrane. Contact pads can be formed at selected locations over the surface of the substrate to provide electrical connections between the IDT and contact bumps to be attached to or formed on the contact pads.

The following describes improved XBAR resonators, filters and fabrication techniques for XBAR resonators that use improved etch fabrication techniques to form cavities in the substrate using a silicon nitride sacrificial layer or tub. These XBAR fabrication processes may be divided into two broad categories known as "the front-side etch option" and the "backside etch option". With the front-side etch option, the piezoelectric plate is attached to a substrate and the active portion of the piezoelectric plate floats over a cavity (the "swimming pool") formed by etching away a tub (e.g., a thickness of an area like a bathtub) of the sacrificial material using an etchant introduced through holes in the piezoelectric plate. With the backside etch option, the piezoelectric plate is attached to a substrate and the active portion of the piezoelectric plate floats over a void etched completely through an area of the substrate and the sacrificial tub from the back side (i.e., the side opposite the piezoelectric plate). The void forms a cavity under the plate. Using the silicon nitride sacrificial tub allows the techniques to: use a simplified front-side etch or back-side etch membrane release by not removing an bonding oxide (BOX) layer below the plate, be processed with existing substrate and release techniques, use a thinner than standard BOX layer, be processed with standard semiconductor materials and etchants, and greatly reduce the burden of cavity etch selectivity versus a (e.g., LN) material of the plate.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers or predetermined areas of an electrically insulating material, such as of silicon thermal oxide (TOX), SiO2, trap rich polycrystalline silicon, and/or another dielectric material. The back surface 114 of the piezoelectric plate 110 or a diaphragm 115 including the plate may be bonded to the substrate 120 using a wafer bonding process, or grown on the substrate 120, or attached to the substrate in some other manner. The piezoelectric plate is attached directly to the substrate; or may be attached to the substrate via one or more layers of electrically insulating material and/or a bonding oxide layer 122, such as a bonding oxide (BOX) layer of SiO2, or another oxide such as Al2O3.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator or a shear-mode film bulk acoustic resonator (SXBAR).

A cavity 140 is formed in the substrate 120 such that a portion 115 of the piezoelectric plate 110 containing the IDT 130 is suspended over the cavity 140 without contacting the substrate 120 or the bottom of the cavity 140. "Cavity" has its conventional meaning of "an empty space within a solid body." The cavity 140 may contain a gas, air, or a vacuum. The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. The cavity may be formed by etching one or more layers of: electrically insulating material, sacrificial material and/or substrate material. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" 115 (for lack of a better term) due to its physical resemblance to the diaphragm of a microphone. As shown in FIG. 1, the diaphragm 115 is contiguous with the rest of the piezoelectric plate 110 around all of a perimeter 145 of the cavity 1. The diaphragm may be continuously and seamlessly connected to the rest of the piezoelectric plate 110 around all, or nearly all, of perimeter of the cavity 140. In this context, "contiguous" means "continuously connected without any intervening item". A BOX layer 122 bonds the plate 110 to the substrate 120 around the perimeter. The BOX layer may exist between the plate and substrate around perimeter 145 and may extend further away from the cavity than just within the perimeter itself. In this case, the BOX layer is everywhere between the piezoelectric plate and the substrate. For example, the BOX layer is not removed from the back of the diaphragm 115 as part of forming the cavity. The IDT 130 is positioned on the piezoelectric plate 110 such that at least the fingers 136 of the IDT 130 are disposed on the diaphragm 115 of the piezoelectric plate that spans, or is suspended over, the cavity 140.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
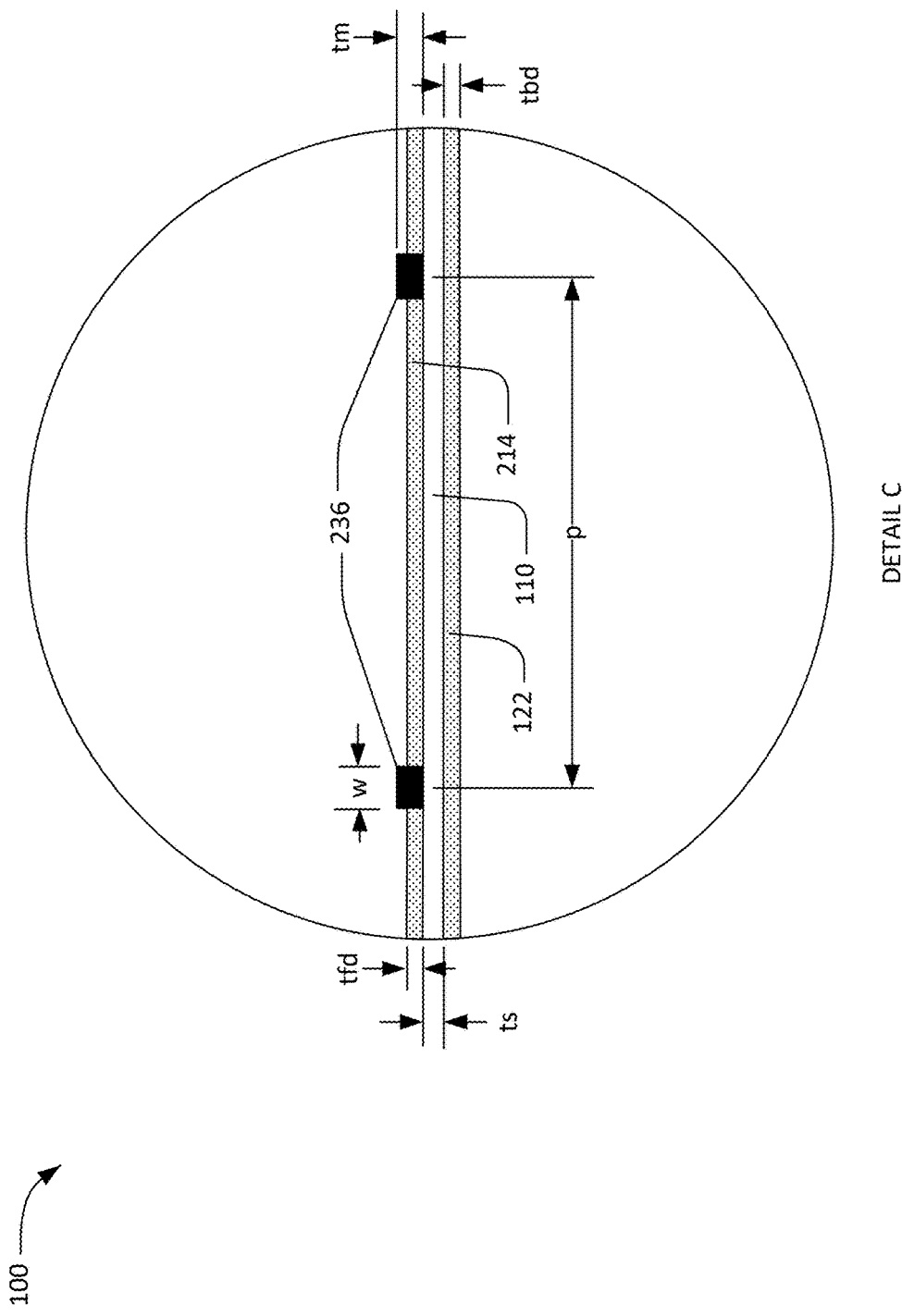
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g., bands n77, n79), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 122 is formed on the back side of the piezoelectric plate 110. The back-side dielectric layer 122 may be the BOX layer 122 of FIG. 1. The back-side dielectric layer 122 has a thickness tbd. The front-side and back-side dielectric layers 214, 122 may be a non-piezoelectric dielectric material, such as silicon dioxide or silicon nitride. The tfd and tbd may be, for example, 0 to 500 nm. tfd and tbd are typically less than the thickness ts of the piezoelectric plate. The tfd and tbd are not necessarily equal, and the front-side and back-side dielectric layers 214, 122 are not necessarily the same material. Either or both of the front-side and back-side dielectric layers 214, 122 may be formed of multiple layers of two or more materials.

In some cases, the tfd and tbd are the same thickness, thus making the XBAR 100 a symmetrical XBAR (SXBAR). Each if their thickness may be between 1-2 microns in thickness. An SXBAR (Symmetrical XBAR) has a dielectric layer on the back and front sides of equal or comparable thickness. Having a significant part or half of the total dielectric thickness of tfd plus tbd on the back side of the plate reduces undesired spurs during use when a radio signal is applied to the IDT. The BOX layer (e.g., layer 122 or 122) can be thin (e.g., 50-200 nm) compared to the thickness of the piezoelectric plate (e.g., 500 nm to 1000 nm). The thicknesses tfd and tbd may each be less than half of thickness ts.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric layer. In some cases, a backside dielectric or BOX layer 122 with the same thickness as the front side dielectric is also formed to create a SXBAR.

Further, a passivation layer may be formed over the entire surface of the XBAR device 100 except for contact pads where electric connections are made to circuity external to the XBAR device. The passivation layer is a thin dielectric layer intended to seal and protect the surfaces of the XBAR device while the XBAR device is incorporated into a package. The front side dielectric layer, backside dielectric, BOX layer and/or the passivation layer may be or include one or more layers of, $SiO_2$, $Si_3N_4$, $Al_2O_3$, some other dielectric material, or a combination of these materials.

The thickness of the passivation layer may be selected to protect the piezoelectric plate and the metal conductors from water and chemical corrosion, particularly for power durability purposes. It may range from 10 to 100 nm. The passivation material may consist of multiple oxide and/or nitride coatings such as SiO2 and Si3N4 material. In some cases, the thickness of the passivation layer is part of the thickness of the front side dielectric such as when forming an SXBAR.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
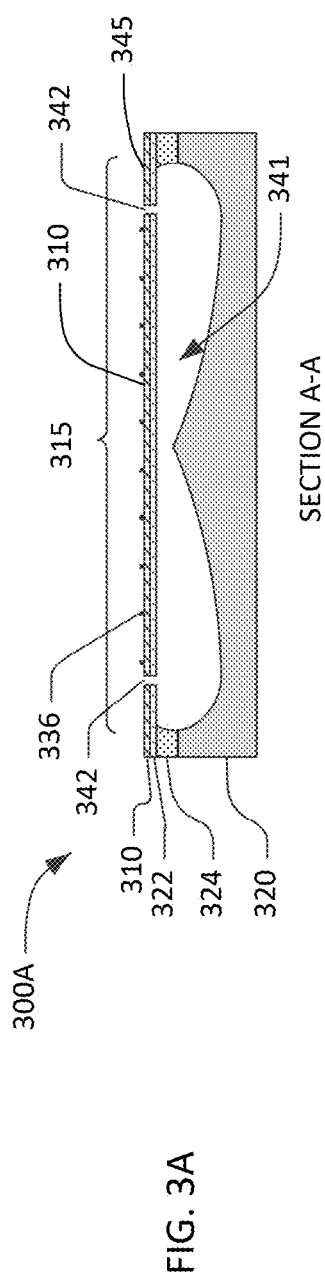
FIGS. 3A and 3B are alternative schematic cross-sectional views of XBARs.
Figure 3B:
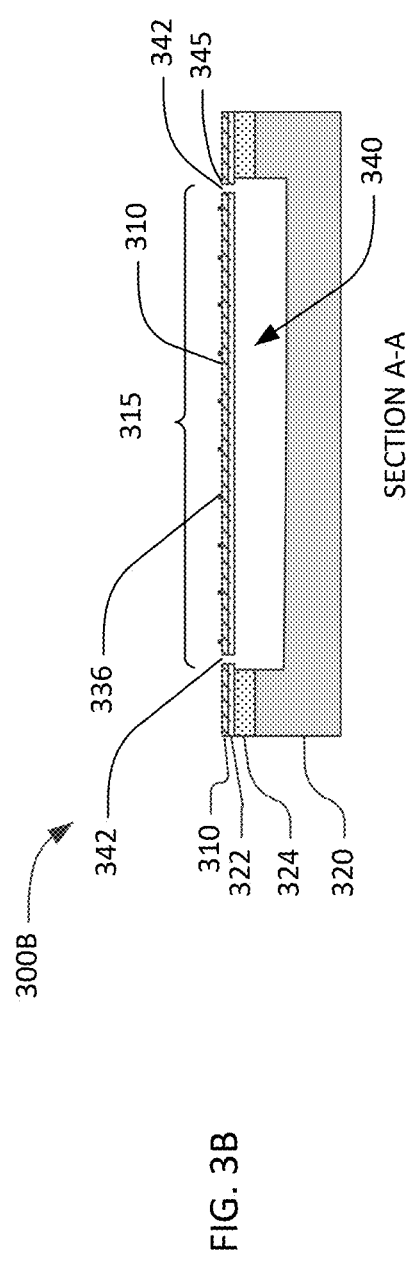

FIG. 3A and FIG. 3B show alternative cross-sectional schematic views of XBAR devices 300A and 300B along the section plane A-A defined in FIG. 1. In FIG. 3A, XBAR 300A has a piezoelectric plate 310 attached to a substrate 320. XBAR 300A may be a version of any of XBARs 100. A portion of the piezoelectric plate 310 forms a diaphragm 315 spanning a cavity 341 in the substrate. The cavity 341, does not fully penetrate the substrate 320, and is formed in the substrate under the portion of the piezoelectric plate 310 containing the IDT of an XBAR. Fingers, such as finger 336, of an IDT are disposed on the diaphragm 315. Plate 310, diaphragm 315 and fingers 336 may be plate 110, diaphragm 115 and fingers 136.

One or more intermediate material layers 322 are attached between plate 310 and substrate 320. An intermediary layer may be or include a bonding layer, a BOX layer, an etch stop layer, a sealing layer, an adhesive layer or layer of other material that is attached or bonded to plate 310 and substrate 320. BOX layer 322 may be one or more layers of silicon thermal oxide (TOX), $Al_2O_3$, $SiO_2$, $Si_3O_4$, $Si_3N_4$ and/or another dielectric oxide material. Layer 322 may be one or more of any of these layers, or a combination of these layers. BOX layer 322 may be a thin oxide layer, such as $SiO_2$, having a thickness of 50-200 nm.

An electrically insulating layer 324 is attached between BOX layer 322 and substrate 320. Layer 324 may be a trap rich electrically insulating layer formed on or in substrate 320. The bonding layer 322 bonds layer 324 to plate 310, such as by chemical, atomic and/or adhesive bonding. Trap rich layer 324 may be, for example, a layer of amorphous or polycrystalline silicon (poly-Si), or a trap rich region of the substrate 320 formed, for example, by ion implantation (e.g., to damage the region). In other embodiments, the BOX layer plate 322 is attached directly to the substrate 320 and a trap rich layer does not exist. Trap rich layer 324 may have thickness of between 0.1-2 um. In some cases, the thickness of the trap-rich layer 324 is between 0.4 um and 1.0 um.

A trap-rich layer may have a plurality of crystal defects that act to trap carriers. This layer may have numerous traps created by silicon dangling bonds in polysilicon that are able to absorb the free carriers attracted at the bonding layer SiO2 322 and substrate Si 320 interface, to greatly reduce substrate losses. This is because the free carriers are trapped in the trap-rich layer 324 and to not make it to the substrate 320. A trap-rich layer can improve the Q by reducing the eddy current losses in the substrate. A trap-rich layer 324 of a polySi layer between the BOX layer 322 and the Si substrate 320 can literally "freeze" the excess of carriers attracted at the Si top surface. The quality factor or Q factor is a dimensionless parameter that describes how underdamped an oscillator or resonator is. It is approximately defined as the ratio of the initial energy stored in the resonator to the energy lost in one radian of the cycle of oscillation.

Substrate 320 may be polymorphic or crystalline silicon (Si) having a thickness of 250-500 um. The substrate 120 may be silicon, glass, lithium niobate, sapphire, quartz, or some other material.

The cavity 341 may be formed by etching the trap rich electrically insulating layer 324 and substrate 320 with a selective etchant that reaches the substrate through one or more holes 324 provided in the BOX layer 322 and piezoelectric plate 310. The diaphragm 315 may be contiguous with the rest of the piezoelectric plate 310 around a large portion of a perimeter 345 of the cavity 341. For example, the diaphragm 315 may be contiguous with the rest of the piezoelectric plate 310 around at least 50% of the perimeter of the cavity 341.

While the cavity 341 is shown in cross-section, it should be understood that the lateral extent of the cavity is a continuous closed band area of substrate 320 that surrounds and defines the size of the cavity 341 in the top perspective direction normal to the plane of the drawing. The lateral (i.e. left-right as shown in the figure) extent of the cavity 341 is defined by the lateral edges substrate 320 and/or perimeter 345. The vertical (i.e., down from plate 310 as shown in the figure) extent or depth of the cavity 341 is from the top surface of trap rich insulating layer 324 into substrate 320 to the bottom of the cavity surface or top of substrate 320 within the cavity. In this case, the cavity 341 has a side cross-section (e.g., from front to pack of the page) rectangular, or nearly rectangular, cross section.

Cavity 341 has a two sideways teardrop like shape with a more shallow vertical depth in the center and deeper teardrop regions extending away from the shallow depth and to either side as shown. The shape of the cavity 341 in FIG. 3A is an artistic rendition of the potential problems with etching the cavity 341 through the trap rich insulating layer 324 and substrate 320 with an etchant introduced through holes in the piezoelectric plate 310. The illustrated shape of the cavity is not based on simulation or measurement of an actual etching process. Since cavity 341 has the more shallow vertical depth in its center and where the plate has a larger amplitude of vibration, when the plate 310 vibrates there is a higher risk of plate contact with that more shallow and central depth as compared to a rectangular cross section shaped cavity having a more uniform vertical depth or a deeper depth in the center of the cavity. The higher risk increases the risk of damaging the plate by its contact with the cavity bottom. Another problem is the uncontrolled lateral growth of the cavity during the etching process.

The XBAR 300A shown in FIG. 3A will be referred to herein as a "front-side etch" configuration since the cavity 341 is etched from the front side of the substrate 320 after attaching the piezoelectric plate 310. The XBAR 100 of FIG. 1 will be referred to herein as a "back-side etch" configuration since the cavity 140 is etched from the back side of the substrate 120 after attaching the piezoelectric plate 110. The XBAR 300A shows one or more holes 342 in the piezoelectric plate 310 at the left and right sides of the cavity 341. However, in some cases holes 342 in the piezoelectric plate 310 are only at the left or right side of the cavity 341.

In FIG. 3B, XBAR 300B has a piezoelectric plate 310 attached to a substrate 320. XBAR 300B may be a version of any of XBARs 100. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT of an XBAR. Fingers, such as finger 336, of an IDT are disposed on the diaphragm 315.

One or more intermediate material layers 322 are attached between plate 310 and substrate 320, such as explained for FIG. 3A. An electrically trap rich insulating layer 324 is attached between BOX layer 322 and substrate 320, such as explained for FIG. 3A.

The cavity 340 may be formed by etching a recess in the trap rich insulating layer 324 and substrate 320 before attaching the piezoelectric plate 310, such as by patterning and etching an area of the trap rich insulating layer and substrate to a desired depth of the cavity. This etch may be performed with an isotropic process such as deep reactive ion etching, resulting a recess in the substrate with precisely controlled dimensions and side walls that are nearly perpendicular to the surface of the substrate. This recess may be filled with a sacrificial layer or tub of material (not shown as it has been etched away). The cavity 340 is then formed by etching away the sacrificial tub formed in the recess with a selective etchant that etches the sacrificial tub through one or more holes 342 through the piezoelectric plate 310 and BOX layer 322. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340. An advantage of this process and/or using the sacrificial tub is leaving the BOX layer 322 with a precisely controlled thickness tbd on the bottom of the plate 310. This allows for precise tuning of the XB AR frequencies.

While the cavity 340 is shown in cross-section, it has a lateral extent, a vertical extent and a cross section defined by the trap rich insulating layer 324, substrate 320 and/or perimeter 345, such as explained for FIG. 3A. Here, cavity 340 has a rectangular shape without a more shallow vertical depth in the center as shown. The shape of the cavity 340 in FIG. 3B avoids the potential problems with etching the cavity 341 through the trap rich insulating layer 324 and substrate 320 with an etchant introduced through holes in the piezoelectric plate 310.

The XBAR 300B shown in FIG. 3B is also a "front-side etch" configuration since the cavity 340 is etched from the front side of the substrate 320, such as through one or more holes 342 in the piezoelectric plate 310 and BOX layer 322.

Figure 4:
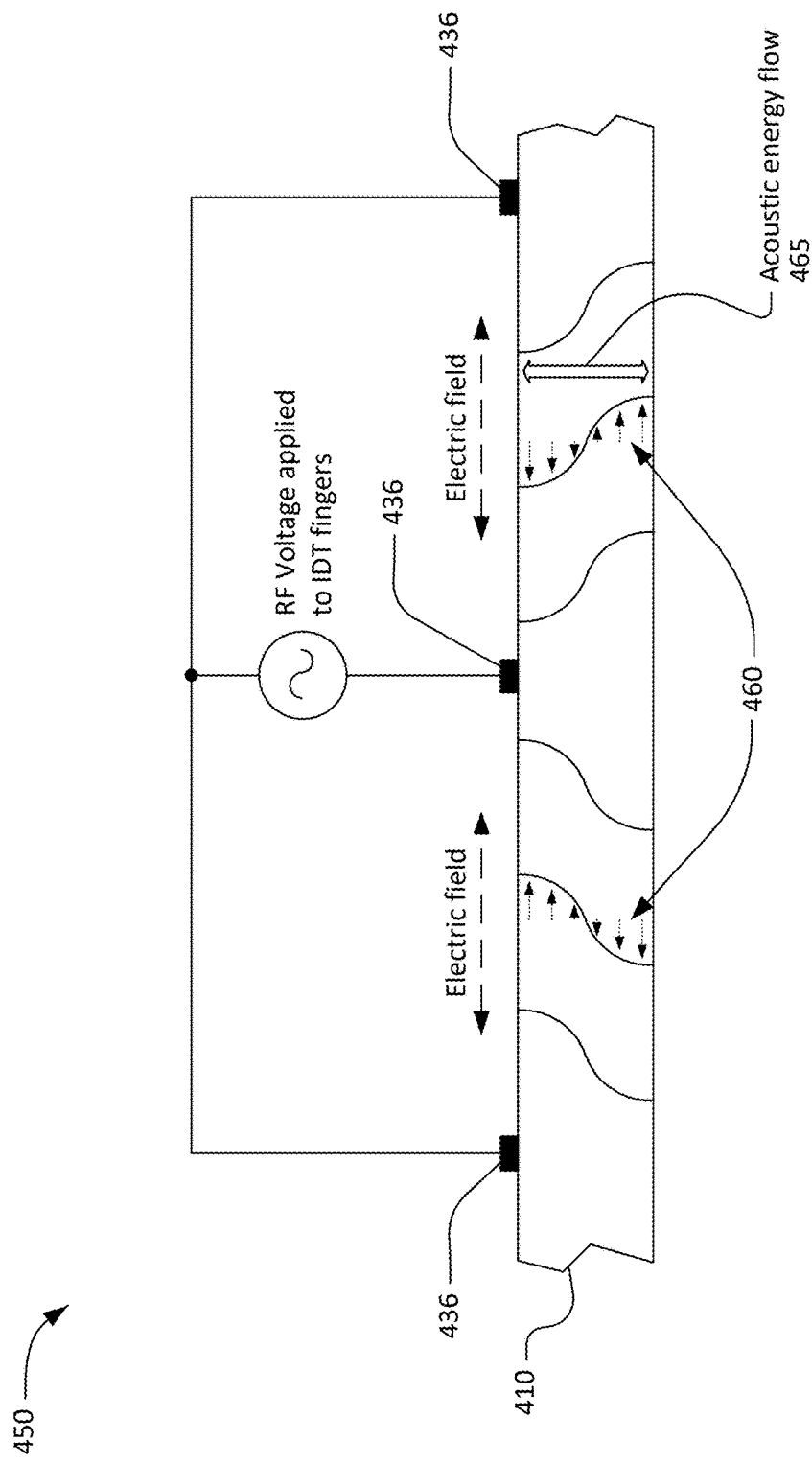
FIG. 4 is a graphical illustration of the primary acoustic mode of interest in an XBAR.

FIG. 4 is a graphical illustration of the primary acoustic mode of interest in an XBAR. FIG. 4 shows a small portion of an XBAR 450 including a piezoelectric plate 410 and three interleaved IDT fingers 436. XBAR 450 may be part of any XBAR herein. An RF voltage is applied to the interleaved fingers 436. This voltage creates a time-varying electric field between the fingers. The direction of the electric field is primarily lateral, or parallel to the surface of the piezoelectric plate 410, as indicated by the arrows 460 labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 410. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 450 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the front and back surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Description of Methods

Figure 5A:
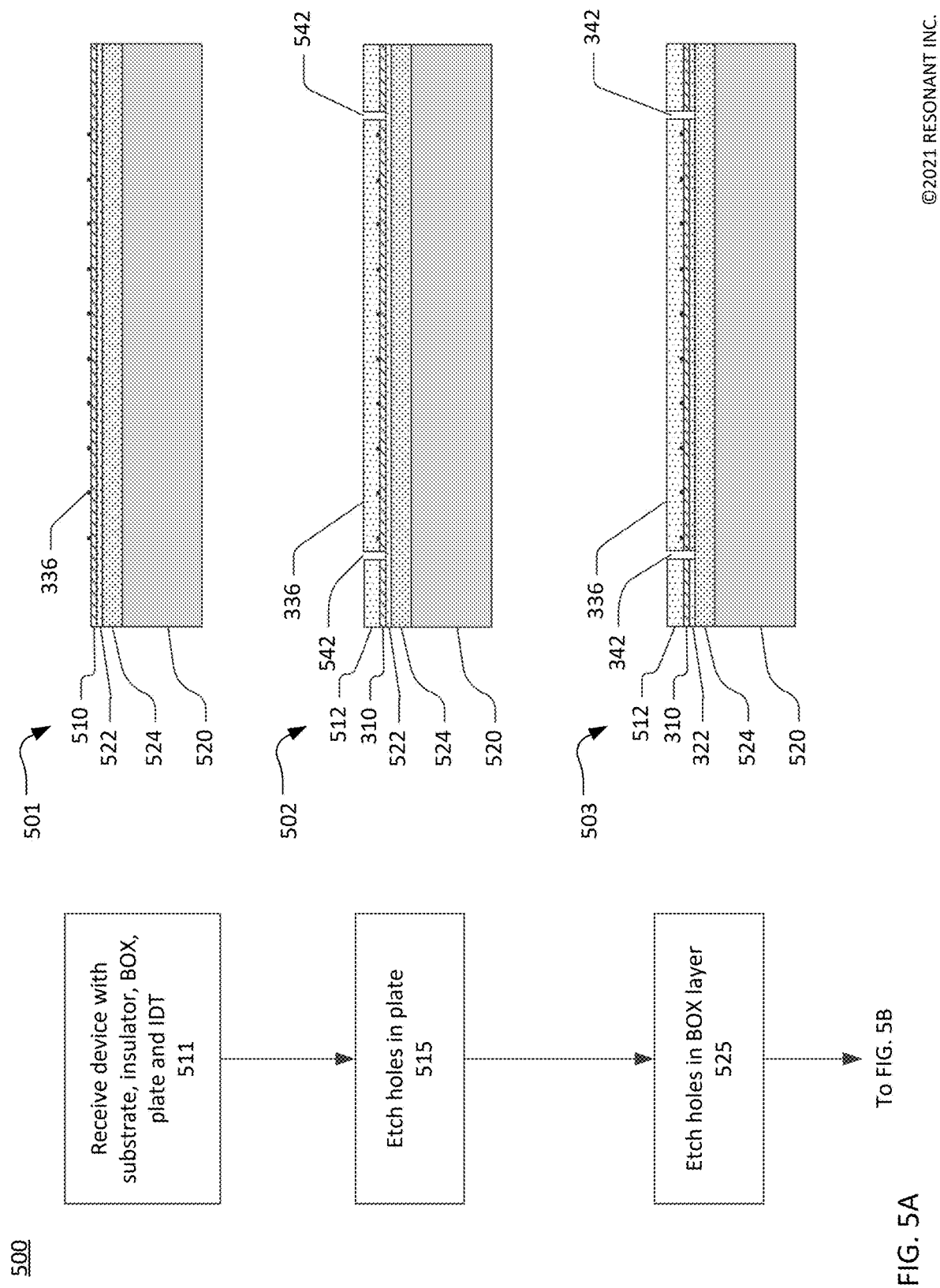
FIGS. 5A and 5B (collectively "FIG. 5") are a flow chart of a process for fabricating an XBAR with front side etched cavities, or front-side membrane release.
Figure 5B:
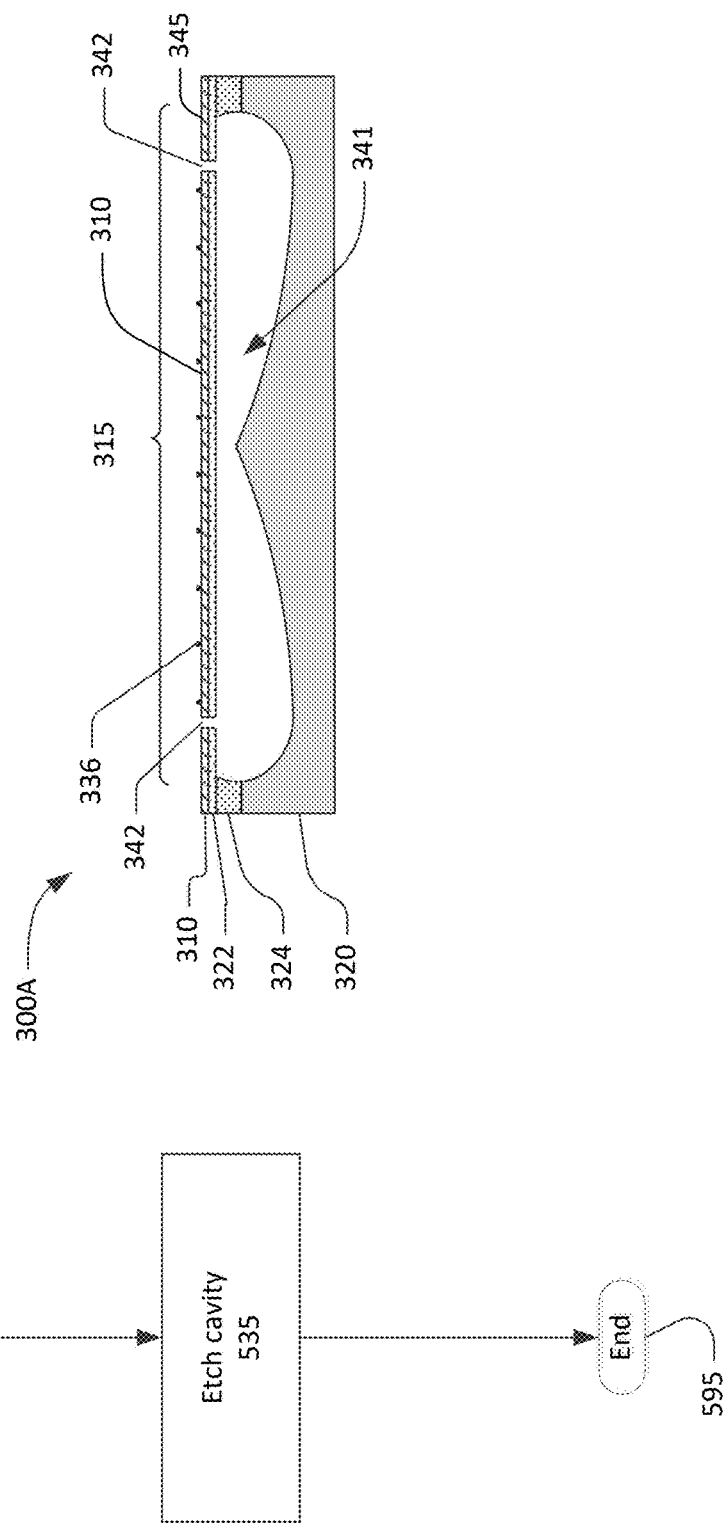

FIGS. 5A and 5B (collectively "FIG. 5") are a flow chart 500 of a process for fabricating an XBAR with front side etched cavities, or front-side membrane release. For chart 500, cavity 341 is etched from the front side of the substrate.

The process 500 may use a mask or photoresist 512 over the plate and IDT; and use a vertical etch-stop under the plate. An etch may us the BOX layer as an etch stop and then another etch may use the insulating layer as an etch stop. A third etch may etch the cavity using a timed etch into the substrate. The three etches can use a photolithography to pattern openings in the LN plate.

To the right of each action in the flow charts 500 and 600 is a schematic cross-sectional view representing the end of each action. The flow chart of FIGS. 5 and 6 include only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIGS. 5 and 6.

The process 500 starts at 511 with obtaining or receiving a device 501 having substrate 520, an insulating layer 524 bonded to a top of the substrate, a BOX layer 522 bonded to a top of the insulating layer, and a plate of piezoelectric material 510 bonded to a top of the BOX layer 522. Insulating layer 524 may be a trap-rich electrically insulating layer of material described for layer 324. An IDT having fingers 336 is formed on a top surface of the plate 510. The process 500 ends at 595 with a completed XBAR or filter 300A. The piezoelectric plate 510 may be a portion of wafer of piezoelectric material.

In another embodiment, the holes 342 are etched at steps 515-525 prior to forming the conductor layer and IDT fingers 336. Here, the conductor layer having IDT fingers 336 is formed at step 535 prior to etching the cavity 341.

The piezoelectric plate 510 and the substrate 540 may be bonded by a wafer bonding process that uses the BOX layer 422.

After 502, the process 500 continues to 515 where device 501 had plate 510 masked and openings formed through the plate 510. Thus, device 502 has a mask 512 formed over the plate 310; and holes 542 etched through the plate 310 and to the BOX layer 522 at locations or areas where holes were formed in the mask 512. Mask 512 may be a photoresist deposited on and bonded to the top surface of the plate. At 515 the plate is selectively etched with respect to the mask 512 an optionally with respect to the BOX layer 522. Etching at 515 may use BOX layer 522 as an etch stop.

The holes 542 may be holes formed through an LN plate by ion milling. The holes 542 may be formed by wet or dry etching away of the plate at areas with respect to the mask 512. In some cases, the etching may be done by a reactive ion etching (RIE), an inductively coupled plasma (ICP) and/or a laser milling process. The BOX layer 522 may function as a vertical etch-stop under the plate to stop the etching at or just below (e.g., 1-5 percent of the layer 522 thickness) the top surface of the BOX layer. Areas for the holes 542 may be locations near and withing perimeter 345.

After 515, at 525 device 502 had holes formed through the BOX layer 522. Thus, device 503 has a mask 512 formed over the plate 310; and holes or holes 342 etched through the plate 310, through the BOX layer 322 and to the insulating layer 524 at locations or areas where holes were formed in the mask 512. At 525 the BOX layer is selectively etched with respect to the mask 512 an optionally with respect to the plate 310. Etching at 525 may use insulating layer 524 as an etch stop.

The holes 342 may be holes formed through the BOX layer by a dry etch oxide or short wet etch such as of hydrofluoric acid (HF) or buffered HF. The holes 342 may be formed by wet or dry etching away of the BOX layer at areas with respect to the mask 512 and material of plate 310. In some cases, the etching may be done by an ion milling, a reactive ion etching (RIE), an inductively coupled plasma (ICP) and/or a laser milling process. The insulating layer 524 may function as a vertical etch-stop under the plate to stop the etching at or just below (e.g., 1-5 percent of the layer 524 thickness) the top surface of the insulating layer.

After 525, at 535 device 503 has cavity 341 etched at an area (e.g., within perimeter 345) through insulating layer 524 and a thickness of the substrate 520. Thus, device 300A has cavity 341 etched through the insulating layer 524 and the substrate 520 at locations or areas where holes were formed in the mask 512 and to a vertical extent or depth desired for cavity 341 to form device 300A. At 535 the insulating layer 324 and the substrate 320 were selectively etched with respect to the mask 512 an optionally with respect to the plate 310 and the BOX layer 322. In other cases, mask 512 is removed after step 525 and before step 535; and the insulating layer 324 and the substrate 320 were selectively etched with respect to the plate 310 and optionally the BOX layer 322. Etching at 525 may be a timed etch to remove the thickness of insulating layer 524 and a desired thickness of substrate 520 to form the vertical extent or depth desired for cavity 341.

The cavity 341 may be formed by an XeF2 etch of silicon to leave the oxide layers. In some cases, as wet or dry etch can be used. An XeF2 etchant for silicon can be used to remove the insulation layer and substrate, that has high selectivity to SiO2 and thus will not remove the desired BOX layer from under the plate in the diaphragm and will not remove any SiO2 formed on the IDT or top of the plate. In some cases, the etch at step 535 is performed by a frontside membrane release (FSMR) technique which is a process to selectively remove the insulating layer 524 and substrate 540 using a highly selective dry vapor etchant such as XeF2. This process can be conducted on the device layer side (e.g., a frontside etch) as opposed to the backside release where a through hole needs to be created in the Si substrate to gain access to the sacrificial material. Mask 512 is removed after etching at 535.

Advantages of process 500 include the following. One, it simplifies front-side membrane release of the plate 310 by not removing oxide or BOX layer 322 which is beneficial because there is no requirement for pre-patterned structures underneath plate 310 with sacrificial "tubs." The cavity 341 can be formed from a configuration of LN holes 342 and the etchant selectivity. Two, the use of XeF2 as an etchant for silicon to remove the insulation layer and substrate has high selectivity to SiO2 and thus will not remove the desired BOX layer from under the plate in the diaphragm and will not remove any SiO2 formed on the IDT or top of the plate which is beneficial because it eliminates two additional processing steps of protecting the SiO2 formed on the IDT and etching of the BOX layer. Three, the back SiO2 layer or BOX layer relies on deposited SiO2 thickness control rather than etch control to ensure a thickness of the BOX layer exists in the diaphragm and that bonds the insulating layer to the plate which is beneficial because the thickness of the BOX layer directly affects the frequency response of the device. Four, it can be processed with existing substrate and release techniques, using a thinner (~100 nm) than standard BOX layer having a thickness of between 1 um and 2 um which is beneficial because thinner BOX layer will contribute less acoustic loss than thicker BOX. Five, it can be implemented with patterned substrates (e.g., with Si sacrificial tubs within SiO2 etch stop barriers, not shown herein) which allows more accurately shaped and rectangular shaped cavities such as cavity 340 what do not harm the vibrating plate. Six, it has limited thermal impact from a thin BOX layer under contact pads (not shown) which beneficially increases thermal conduction of heat generated by the plate and conducted into the substrate, out of the substrate through the contact pads into packaging for better cooling.

A difficulty of process 500 is that: 1) it increases substrate complexity due to the addition of LN hole placement and etching and the increased complexity can cause LN hole-to-IDT alignment and IDT topology problems; and/or 2) high membrane-membrane lateral spacing between XBARS is required for un-patterned substrates due to the isotropic etching properties and the high lateral spacing causes increased device size and device layout problems.

Figure 6A:
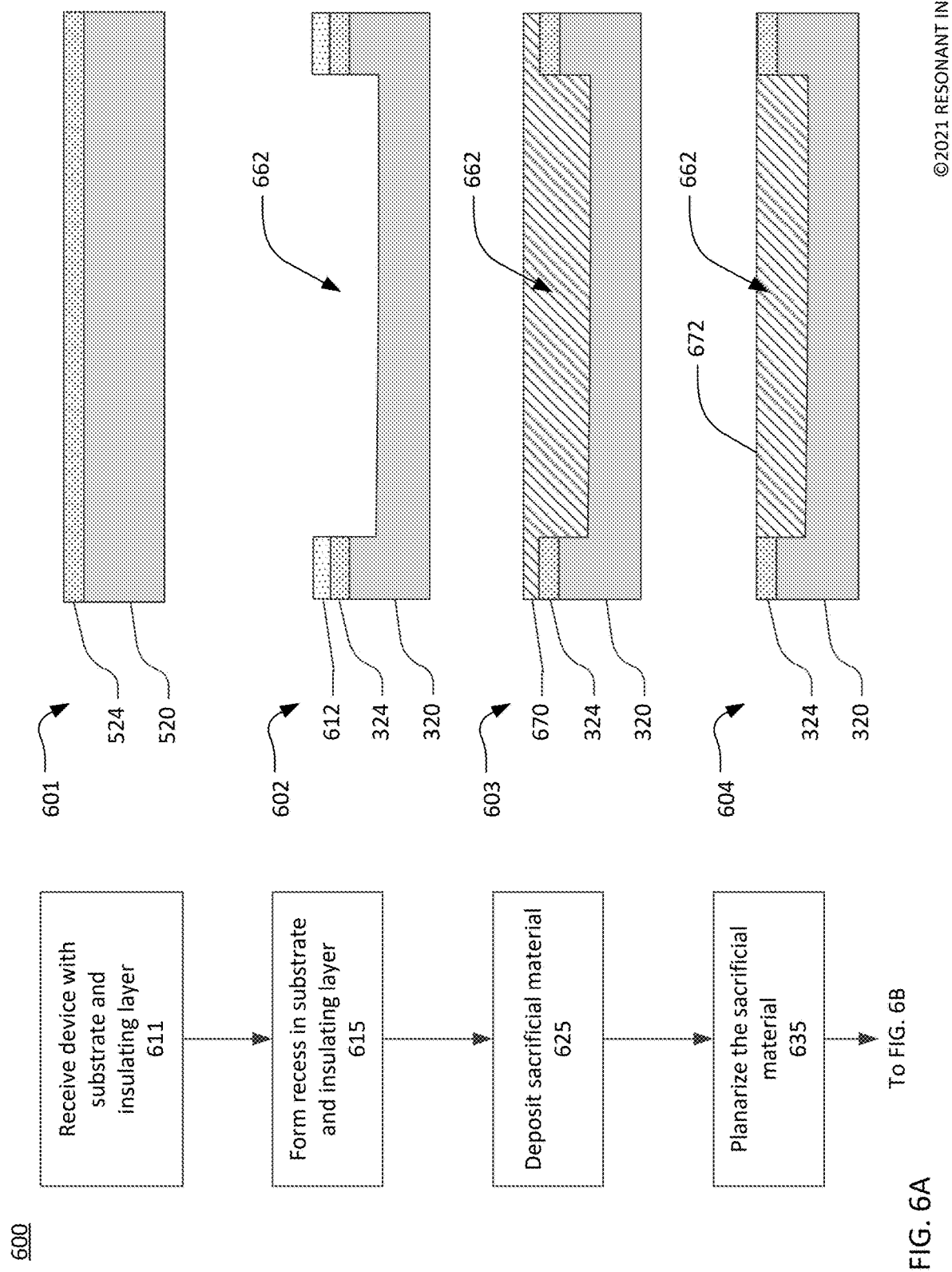
Figure 6B:
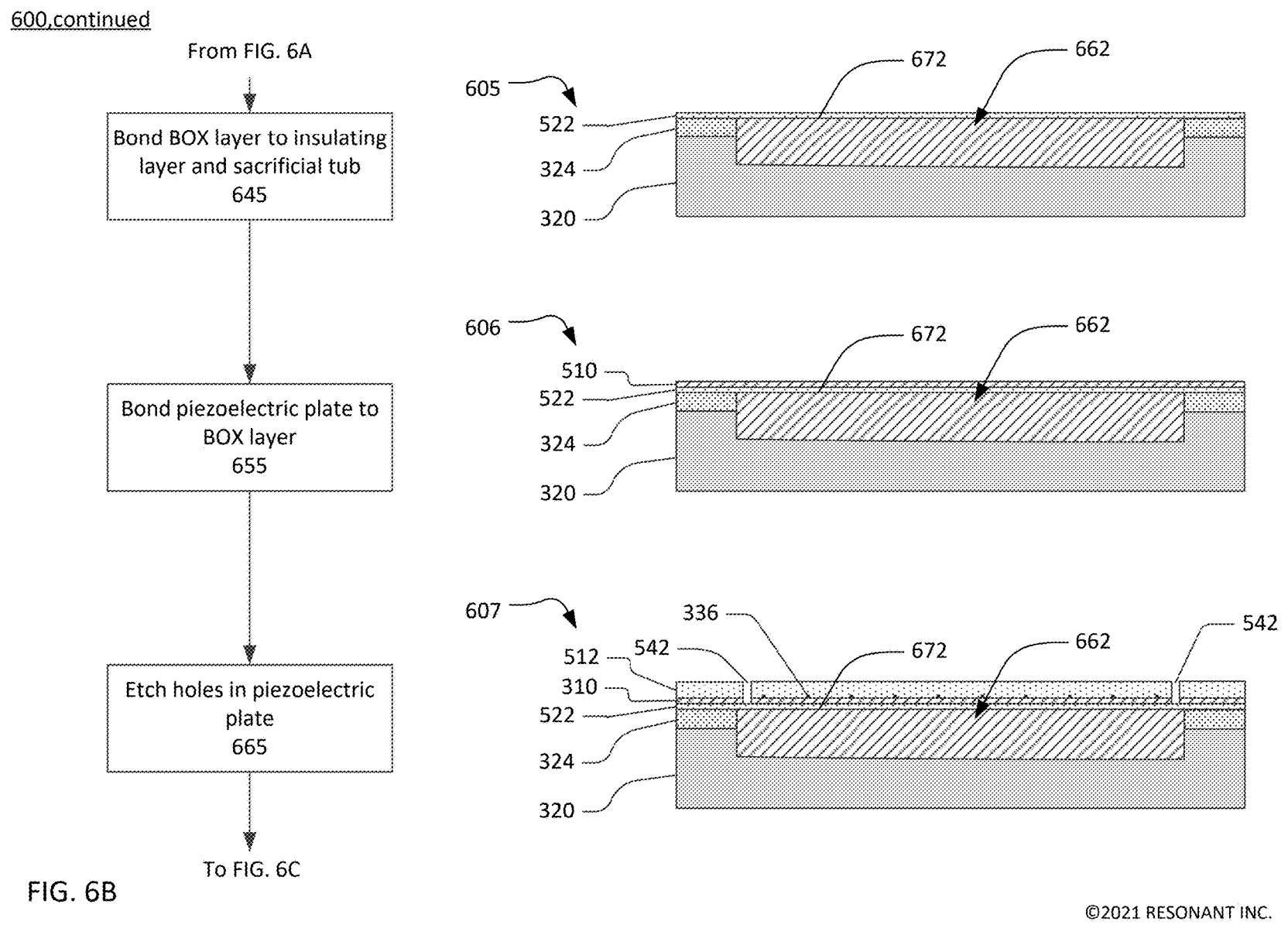
Figure 6C:
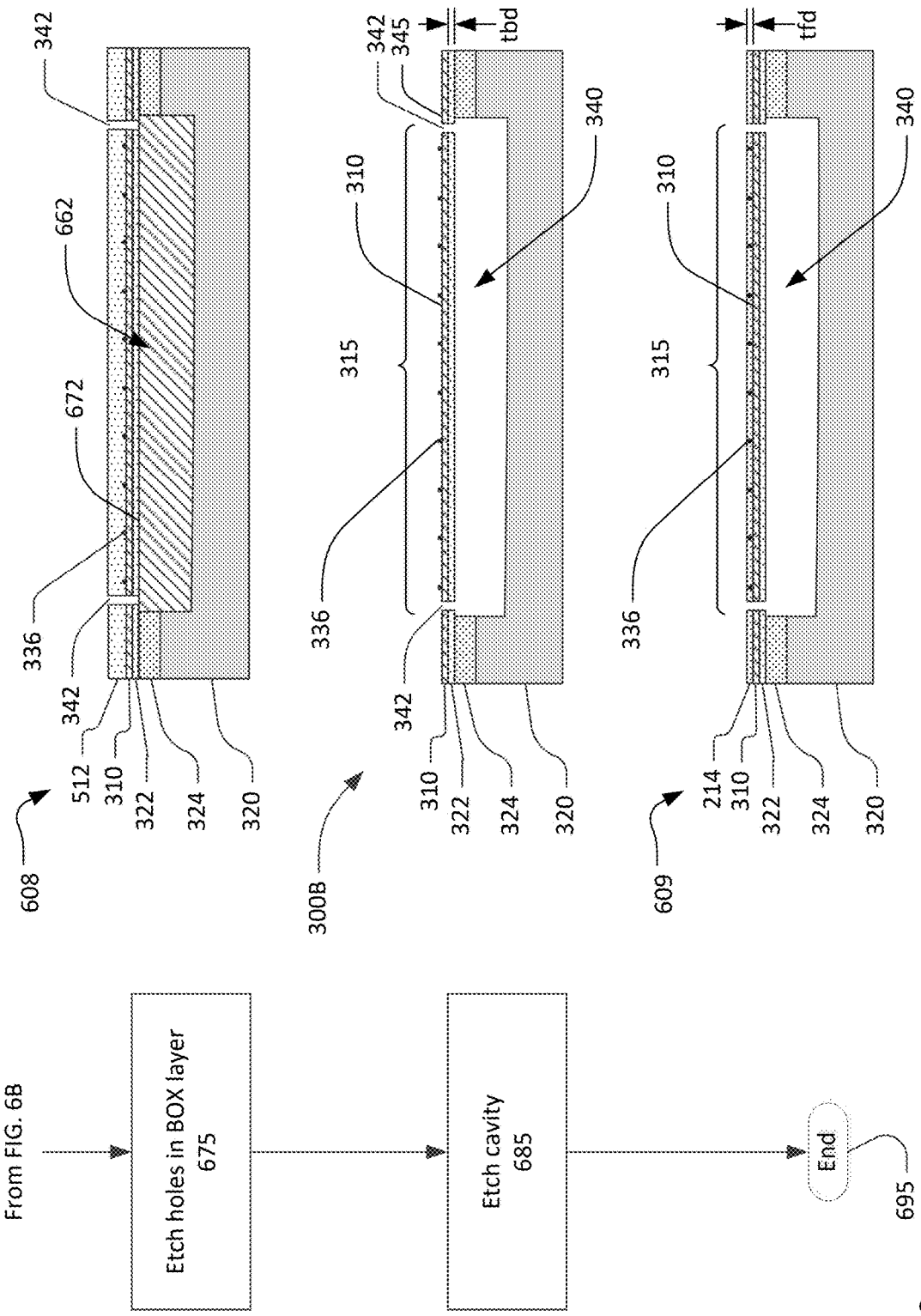

FIGS. 6A, 6B and 6C (collectively "FIG. 6") are a flow chart 600 of a process for fabricating an XBAR using a sacrificial tub 672, front side etched cavities 340 and front-side membrane release. The process 600 uses a predefined sacrificial tub 672 of material formed in a recess 662 in the silicon carrier wafer prior to bonding the substrate wafer to the piezoelectric plate (e.g., of LiNbO3-LN, or another piezoelectric material). The pre-defined recess 662 filled with a tub 672 of sacrificial material (e.g., silicon nitride) defines the size and boundaries of the cavity 340 when etched from the front side through the plate 310. Process 600 may fabricate an XBAR by front side etching a cavity 340 under plate 310 using an isotropic etch. The etch may be a wet or dry etch. The process 600 is or is included in the forming of XBAR 300B as shown in FIG. 3B.

The process 600 starts at 611 with obtaining or receiving a device 601 having substrate 520 and insulating layer 524 formed on or in a top of the substrate. Insulating layer 524 may be a trap-rich electrically insulating layer of material described for layer 324. The process 600 ends at 695 with a completed XBAR or filter 300B. Substrate 520 may be a silicon carrier wafer. At 611, the substrate 520 or device 601 may be received such as by being obtained or purchased from an outside source.

After 611, at 615, recesses 662 are formed in the trap rich layer 524 and substrate 520 in the locations where the cavity 340 is desired to form device 602. The recesses may be cavity openings in the material of trap rich layers 524 and in substrate 520. While the recesses 662 are only shown in cross-section in FIG. 6, it must be understood that each recess 662 is a three-dimensional created by removing material from the trap rich insulating layer 524 and substrate 520 to form trap rich insulating layer 324 and substrate 320. Recess 662 may have a cross-sectional shape (normal to the plane of the drawing) that is a rectangle, a regular or irregular polygon, oval, or some other shape desired for cavity 340. The recess 662 may be formed by patterning and etching an area of the trap rich insulating layer and substrate to a desired depth of the cavity. The recess 662 may be formed by etching the trap rich insulating layer 524 and substrate 520 through a suitable mask 612 such as a photoresist mask or a hard mask. The recesses 662 may be etched into the trap rich insulating layer 524 and substrate 520 using a suitable anisotropic etching process. The recesses may be formed by a first etch to the trap rich insulating layer 524 which may use the substrate as an etch stop, and a second etch to etch the substrate 520, which may be a timed etch. For example, when the substrate is silicon, the recesses may be formed using deep reactive ion etching (DRIE). Another exemplary etch could be etching in an inductively coupled plasma (ICP) chamber or using an ion mill. Other anisotropic etching processes may be used on trap rich insulating layer 524 and substrate 520 materials.

Forming recess 662 may be masking and etching a top surface of trap rich insulating layer 524 to form recess 662 that leaves some substrate 520 material underneath the recess. The recess 662 may have a depth of between 1 and 10 μm thick. Recess 662 may be predefined etch region in the trap rich insulating layer 524 and silicon carrier wafer prior to bonding the wafer to an active piezoelectric (e.g., LiNbO3 or other material) wafer or plate (e.g., at 655). Recess 662 can be pre-defined regions in device 602 that are to be filled with a sacrificial tub 672 to constrain or limit the size of the resonator plate membranes when material 672 is etched from the front side through holes 342.

At 625, the recess 662 is filled with a sacrificial material 670 to form device 603. The sacrificial material 670 can be any material that can be subsequently removed by selectively etching, dissolving, or some other process that removes material 670 with respect to the material of trap rich insulating layer 324 and substrate 320. The sacrificial material 670 may be silicon nitride, $Si_3N_4$. In this case, the tub 672 may be etched with phosphoric acid ($H_3PO_4$). In another case, the sacrificial material 670 may be phosphosilicate glass (PSG) that can be etched with vapor Hydrogen Fluoride (HF) or an etchant mixture of carboxylic acid, hydrogen fluoride, and water. In a third case, the sacrificial material 670 may be spin-on glass (SOG) that can be etched with HF acid.

Filling the recess 662 may be forming a blanket layer of sacrificial material 670 in the recess 662 and over the top of the trap rich insulating layer 524 as shown.

At 635, the sacrificial material 670 is planarized to form sacrificial tub 672 of the sacrificial material and device 604. For example, after the recess 662 is filled with sacrificial material 670, the surface of the material 670 may be uneven and thus should be planarized. Planarization may be performed by mechanical polishing, by chemical-mechanical polishing (CMP), or some other method. In some cases, planarizing is CMP the material 670 until the top surface of material of trap rich insulating layer 324 is exposed. The surface of trap rich insulating layer 324 may stop removal of the sacrificial layer by the polishing because it is polished magnitudes slower by the CMP process than that of material 670. In some cases, CMP of trap rich insulating layer 324 is performed to expose and to polish off some (e.g., less than 10 percent) of the thickness of layer 324. Thus, the sacrificial tub 672 may have a thickness of between 1 and 10 μm thick and the tub 672 may be predefined volume in the trap rich insulating layer 524 and silicon carrier wafer prior to bonding the wafer to an active piezoelectric (e.g., LiNbO3 or other material) wafer or plate (e.g., at 655).

In subsequent process steps, a piezoelectric plate 510 will be bonded to the substrate and the sacrificial material will be removed to form cavities 340 under the piezoelectric plate. The process will remove all or substantially all of tub 672 without removing any or barely any of the material of trap rich insulating layer 324 and substrate 320.

Steps 615-635 may be described as a shallow trench isolation (STI) implementation, also known as box isolation technique, that is an integrated circuit feature which prevents electric current leakage between adjacent semiconductor device components.

At 645 a BOX layer 522 is bonded to a top of the trap rich insulating layer 324 and the top of the sacrificial tub 672 to form device 605. BOX layer 522 may be bonded to layer 324 and tub 672 by chemical, atomic and/or adhesive bonding.

At 655 a plate of piezoelectric material 510 is bonded to a top of the BOX layer 522 to form device 606. The piezoelectric plate 510 and the BOX top layer may be bonded by a wafer bonding process. Plate 510 may be bonded to BOX layer 522 by chemical, atomic and/or adhesive bonding. After the plate is bonded, it may be planarized to form piezoelectric plate 510. Planarizing the plate may include thinning the plate by ion slicing, CMP or some other method to polish the plate to a desired thickness of plate 310.

At 665 device 606 has had an IDT with fingers 336 formed on a top surface of plate 510; and plate 510 has been masked and holes 542 are formed through the plate 510, thus forming device 607. A mask may be patterned onto the top of plate 510 to form the IDT. Forming IDT may include forming conductor patterns and dielectric layers defining one or more XBAR devices on the surface of the piezoelectric plate 510. Step 665 may include forming a conductor pattern on a front surface of the piezoelectric plate, where the conductor pattern includes an interdigital transducer (IDT) with interleaved fingers disposed over the recess 662. Typically, a filter device will have an IDT as a first of two or more conductor layers that are sequentially deposited and patterned. The IDT layers may be, for example, aluminum, an aluminum alloy, copper, a copper alloy, molybdenum, tungsten, beryllium, gold, or some other conductive metal. Optionally, one or more layers of other materials may be disposed below (i.e. between the IDT layer and the piezoelectric plate) and/or on top of the IDT. For example, a thin film of titanium, chrome, or other metal may be used to improve the adhesion between the IDT layer and the piezoelectric plate.

The IDT may be formed by depositing the conductor layers over the surface of the piezoelectric plate and removing excess metal by etching through a patterned photoresist that covers areas of the IDT. Alternatively, the IDT may be formed using a lift-off process. Photoresist may be deposited over the piezoelectric plate and patterned to remove areas that leave behind or define the IDT. The IDT material may be deposited in sequence over the surface of the photoresist and piezoelectric plate. The photoresist may then be removed, which removes the excess material, leaving the IDT.

Forming the IDT may include forming one or more dielectric layers on the plate and/or IDT, such as a front side dielectric and/or a passivation layer as noted herein. The plate 510 may have one or more backside dielectric before being bonded at 655. The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs. The one or more dielectric layers may also include, for example, depositing an encapsulation/passivation layer such as $SiO_2$ or $Si_3O_4$ over all or a portion of the device.

Then, plate 510 may be masked and holes 542 formed through the plate 310. Device 607 has a mask 512 formed over the plate 310; and openings or holes 542 etched through the plate 310 and to the BOX layer 522 at locations or areas where holes were formed in the mask 512 such as noted at step 515.

While the holes 542 are only shown in cross-section in the figures, it must be understood that each hole 542 is a three-dimensional opening created by removing material from the plate. Holes 542 may have a cross-sectional shape (normal to the plane of the drawing) that is a rectangle, a regular or irregular polygon, oval, or some other shape desired for etching through to form cavity 340.

Move After 655, process 600 may use a mask or photoresist 512 over the plate and IDT; and use a vertical etch-stop under the plate. An etch may us the BOX layer 522 as an etch stop and then another etch may use the trap rich insulating layer 524 as an etch stop. A third etch may etch the cavity by selectively etching sacrificial tub 672. The three etches can use a photolithography to pattern holes in the LN plate.

In another embodiment, the holes 342 are etched at steps 665-675 prior to forming the conductor layer and IDT with fingers 336 on the plate. Here, the conductor layer having IDT fingers 336 (and optional dielectric layers) is formed at step 685 prior to etching the cavity 340.

A 675 device 607 had holes 342 formed through the BOX layer 522 thus forming device 608. Thus, device 608 has a mask 512 formed over the plate 310; and holes or holes 342 etched through the plate 310, through the BOX layer 322 and to the sacrificial tub 672 at locations or areas where holes were formed in the mask 512. At 675 the BOX layer is selectively etched with respect to the mask 512 an optionally with respect to the plate 310. Etching at 675 may use sacrificial tub 672 as an etch stop.

The holes 342 may be holes formed through the BOX layer by a dry etch oxide or short wet etch such as of hydrofluoric acid (HF) or buffered HF. The holes 342 may be formed by wet or dry etching away of the BOX layer at areas with respect to the mask 512 and material of plate 310. In some cases, the etching may be done by an ion milling, a reactive ion etching (RIE), an inductively coupled plasma (ICP) and/or a laser milling process. The sacrificial tub 672 may function as a vertical etch-stop under the plate to stop the etching at or just below (e.g., 1-5 percent of the sacrificial tub 672 thickness) the top surface of the sacrificial tub 672.

At 685 device 608 has cavity 340 formed by etching away the sacrificial tub 672 formed in the recess 662 with a selective etchant that etches the sacrificial tub through one or more holes 342 through the piezoelectric plate 310 and BOX layer 322 without removing the BOX layer from over the cavity, thus forming device 300B. Etching at 675 may fabricate an XBAR by front side etching the sacrificial tub 672 to form cavity 340 using an isotropic etch. The etch may be a wet or dry etch. Cavity 340 may be formed where the sacrificial but 672 was removed.

Isotropic etching may include using an etchant in liquid-, gas- or plasma-phase. The liquid etchant may be buffered hydrofluoric acid (BHF) such as used for silicon dioxide etching. Unlike anisotropic etching, isotropic etching does not etch in a single direction, but rather etches in multiple directions within the silicon nitride tub. However, isotropic etching has the advantage of being faster than anisotropic etching. Typical etch rates for isotropic etching range from a few microns to several tens of microns per minute, while anisotropic etching generally has an etch rate of about 1 µm/min.

When the sacrificial material 670 is silicon nitride, Phosphoric etching of the silicon nitride tub (e.g., etching of $Si3N4$) may include using phosphoric acid ($H3PO4$) at a temperature of 140-200° C. Typical selectivities in phosphoric etch are 10:1 for nitride over oxide and 30:1 for nitride over Si. When the sacrificial material 670 is phosphosilicate glass (PSG) the tub 672 may be etched with vapor Hydrogen Fluoride (HF) such as an etchant mixture of carboxylic acid, hydrogen fluoride, and water. When the sacrificial material 670 is spin-on glass (SOG) the tub 672 may be etched with HF acid.

Thus, cavity 340 is in an area (e.g., within perimeter 345) through trap rich insulating layer 524 and a thickness of the substrate 520 defined by recess 662. Device 300B has cavity 340 through the trap rich insulating layer 524 and the substrate 520 to a vertical extent or depth desired for cavity 340. At 535 the sacrificial tub 672 was selectively etched with respect to the mask 512, the plate 310, the trap rich insulating layer 324 and the BOX layer 322. In other cases, mask 512 is removed after step 665 and before step 685; and the sacrificial tub 672 is selectively etched with respect to the plate 310, the BOX layer 322 and the trap rich insulating layer 324. The BOX layer 322 having thickness remains on the bottom of the plate above the cavity 340 within the diaphragm 315. It may be BOX layer 122 having thickness tbd.

The cavity 340 may be formed by an isotropic, HF and/or Phosphoric etch, that has high selectivity to SiO2 and thus will not remove the desired BOX layer from under the plate in the diaphragm and will not remove any SiO2 formed on the IDT or top of the plate. In some cases, the etch at step 685 is performed by a frontside membrane release (FSMR) technique which is a process to selectively remove the sacrificial tub 672 using a highly selective dry vapor etchant such as Phosphor or HF. This process can be conducted on the device layer side (e.g., a frontside etch) as opposed to the backside release where a through hole needs to be created in the Si substrate to gain access to the sacrificial material.

Etching at 685 can be selectively etching, dissolving, or some other process that removes material 670 with respect to the material of trap rich insulating layer 324, BOX layer 322 and substrate 320. The etching process will remove all or substantially all of tub 672 without removing any or barely any of the material of trap rich insulating layer 324, BOX layer 322 or substrate 320. Mask 512 is removed after etching at 685.

At 695, after 685, a front dielectric and/or encapsulation layer 214 may be formed over the XBAR 300B to form device 609. For example, a frontside dielectric layer 214 may be formed on the front surface of the piezoelectric plate 310. The front dielectric and/or encapsulation layer is shown not formed over or thicker than the fingers 336. In other cases, the front dielectric and/or encapsulation layer is formed over the fingers 336 (not shown). At 695, thickness tfd of the frontside dielectric 214 may be equal to a thickness tbd of the BOX layer 122 to form an SXBAR as noted for FIG. 2.

However, substantial equality of the tfd and tbd is preferred but not necessary to achieve a significant reduction in undesired spurious modes during operation. Some spurious modes may be reduced if the thickness tbd of the BOX layer is at least one-third and less than two-thirds of the thickness of the tfd plus tbd. In some cases, the front-side dielectric layer and the BOX layer are the same material, and a thickness tfd of the front-side dielectric layer and a thickness tbd of the BOX layer satisfy the relationship 0.5 tfd<tbd<1.5 tfd. When the front-side dielectric layer and BOX layers are the same material, significant reduction of at least some spurious modes will be achieved when 0.5 tfd<tbd<1.5 tfd.

In some cases, the front-side dielectric layer and BOX layer are both silicon dioxide dielectric layers; and both tfd, tbd are 145 nm, or 0.326 times the thickness is of the piezoelectric plate. In some cases, the IDT fingers 336 are aluminum; the front-side dielectric layer and BOX layer are silicon dioxide; and tm=tfd=tbd. The term "thickness" means the physical or mechanical thickness.

Process 600 may be a way of making the symmetric XBAR, which requires a thin, controlled thickness, BOX dielectric layer 322 on the back side of the piezoelectric diaphragm. An advantage of this process 600 and/or using the sacrificial tub 672 is leaving the BOX layer 322 with a precisely controlled thickness tbd on the bottom of the plate 310, which allows for precise tuning of the XBAR frequencies. Another advantage of this process 400 and/or using the sacrificial tub 672 is that there is no vast growth of the etched material at locations (e.g., in the center) in the area of the cavity during the etching, such as shown in FIG. 3A.

Other advantages of process 600 include those noted above for process 500. The advantages of process 600 also include that: 1) it can use standard semiconductor materials and etchants thus reducing costly design updates and new materials; 2) it greatly reduces the burden of etch selectivity versus the plate (e.g., LN material) by the use of an isotropic, HF and/or Phosphoric acid etchant for the sacrificial material because this etchant has high selectivity to the plate 310 material and thus will not remove the desired plate material in the diaphragm which is beneficial because it is important to know the plate thickness there in order to tune the XBAR; 3) the back SiO2 layer or BOX layer relies on deposited SiO2 thickness control rather than etch control to ensure a precisely controlled thickness of the BOX layer exists in the diaphragm. Thickness control of the BOX layer may be necessary since the resonance frequency of the XBAR may be set by the total diaphragm thickness, including the BOX layer.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. A method of forming a filter device using a sacrificial layer and a front side etched cavity comprising:
    forming a recess in a silicon substrate with a trap-rich top layer;
    filling the recess with sacrificial silicon nitride;
    forming a bonding oxide (BOX) layer over the trap-rich layer and the sacrificial silicon nitride filled recess;
    bonding a piezoelectric plate to the BOX layer; and
    removing the sacrificial silicon nitride using an etchant introduced through holes in the piezoelectric plate and BOX layer to form a cavity without removing the BOX layer from over the cavity.

2. The method of claim 1, wherein:
    forming the recess in the silicon substrate includes patterning the top of the trap-rich top layer and front side etching through the trap-rich top layer and into the substrate; and
    wherein removing the silicon nitride comprises using an isotropic Phosphoric acid etch through the holes to remove the silicon nitride but not the BOX layer.

3. The method of claim 1, wherein removing the silicon nitride includes front side releasing a portion of the piezoelectric plate over the cavity to form a diaphragm spanning the cavity.

4. The method of claim 3, further comprising:
    forming a conductor pattern on a front surface of the piezoelectric plate, wherein the conductor pattern includes an interdigital transducer (IDT) with interleaved fingers disposed on the diaphragm over the cavity; and
    forming a frontside dielectric on the front surface of the piezoelectric plate, wherein a thickness of the frontside dielectric is equal to a thickness of the BOX layer.

5. The method of claim 4, wherein filling the recess includes depositing a blanket layer of silicon nitride material over the recess and trap-rich top layer, then polishing the blanket layer silicon nitride.

6. The method of claim 4, wherein:
    the piezoelectric plate and the IDT are configured such that radio frequency signals applied to the IDT excite a primary shear acoustic mode in the piezoelectric plate over the cavity; and wherein a combined thickness of the diaphragm, of the frontside dielectric and of the BOX layer are selected to tune the primary shear acoustic modes in the piezoelectric plate.

7. The method of claim 4, wherein the thickness of the frontside dielectric and the thickness of the BOX layer are each between 50-200 nm and a thickness of the piezoelectric plate is between 500 nm to 1000 nm; and wherein the thicknesses of the frontside dielectric and the thickness of the BOX layer are each less than half of thickness of the piezoelectric plate.

8. The method of claim 1, wherein the substrate is Si, the BOX layer is SiO2, the IDT is metal, and the piezoelectric plate is one of lithium niobate or lithium tantalate; and wherein the cavity has a rectangular shape without a more shallow vertical depth in the center.

9. The method of claim 1, wherein the substrate is a polymorphic or crystalline silicon (Si) material having a thickness of 250-500 um;
    the silicon nitride is a sacrificial tub having a predefined volume in the trap-rich layer and substrate, and has a thickness of between 1 and 10 µm thick;
    the BOX layer is an $SiO_2$ layer having a thickness of 50-200 nm; and
    the trap-rich layer is a polysilicon electrically insulating layer having a thickness of 1-10 um.

10. The method of claim 1, wherein forming the recess includes patterning and etching an area of the trap-rich layer and substrate to a desired depth of the cavity;
    wherein forming the silicon nitride includes filling the recess with a sacrificial tub of material; and
    wherein removing the silicon nitride comprises etching away the sacrificial tub with a selective etchant that etches the sacrificial tub through the holes but does not etch the plate, the BOX layer or trap-rich layer.

11. A method of forming a filter device using a sacrificial layer and a front side etched cavity comprising:
    forming a recess in a silicon substrate;
    filling the recess with a sacrificial layer;
    forming a bonding oxide (BOX) layer over the substrate and the sacrificial layer filled in the recess;
    bonding a piezoelectric plate to the BOX layer;
    removing the sacrificial layer using an etchant introduced through holes in the piezoelectric plate and BOX layer to form a cavity without removing the BOX layer from over the cavity; and
    forming a frontside dielectric over the plate.

12. The method of claim 11, wherein
    the front-side dielectric layer and the BOX layer are the same material, and
    a thickness tfd of the front-side dielectric layer and a thickness tbd of the BOX layer satisfy the relationship 0.5 tfd<tbd<1.5 tfd.

13. The method of claim 11, wherein the front-side dielectric layer and the BOX layer are silicon dioxide dielectric layers; and tfd and tbd are 145 nm, or 0.326 times the thickness of the piezoelectric plate.

14. The method of claim 11, wherein:
    forming the recess in the silicon substrate includes patterning a top of a trap-rich top layer of the substrate and front side etching through the trap-rich top layer and into the substrate; and
    wherein removing the sacrificial layer includes front side releasing a portion of the piezoelectric plate over the cavity to form a diaphragm spanning the cavity.

15. The method of claim 11, further comprising:
    forming a conductor pattern on a front surface of the piezoelectric plate, wherein the conductor pattern includes an interdigital transducer (IDT) with interleaved fingers disposed on the diaphragm over the cavity.

16. The method of claim 15, wherein the IDT fingers are aluminum and the front-side dielectric layer and BOX layer are silicon dioxide, and wherein a thickness tm of the fingers is equal to a thickness of the front-side dielectric layer which is equal to a thickness of the BOX layer.

17. A method of forming a filter device using a sacrificial layer and a front side etched cavity comprising:
    forming a recess in a silicon substrate;
    filling the recess with a sacrificial layer;
    forming a bonding oxide (BOX) layer over the substrate and on the sacrificial layer in the recess;
    bonding a piezoelectric plate to the BOX layer;
    forming a conductor pattern on a front surface of the piezoelectric plate, wherein the conductor pattern includes an interdigital transducer (IDT) with interleaved fingers disposed over the recess;
    removing the sacrificial layer using an etchant introduced through holes in the piezoelectric plate and BOX layer to form a cavity where the sacrificial layer was removed without removing the BOX layer from over the cavity; and forming a frontside dielectric over the plate.

18. The method of claim 17, wherein forming the sacrificial layer includes blanket layer depositing silicon nitride material over the recess and substrate, then polishing the blanket layer silicon nitride.

19. The method of claim 17, wherein:

the piezoelectric plate and the IDT are configured such that radio frequency signals applied to the IDT excite a primary shear acoustic mode in the piezoelectric plate over the cavity; and wherein a combined thickness of the diaphragm, of the frontside dielectric and of the BOX layer are selected to tune the primary shear acoustic modes in the piezoelectric plate.

20. The method of claim 17, wherein the thickness of the frontside dielectric and the thickness of the BOX layer are each between 50-200 nm and a thickness of the piezoelectric plate is between 500 nm to 1000 nm; and wherein the thicknesses of the frontside dielectric and the thickness of the BOX layer are each less than half of thickness of the piezoelectric plate.

\* \* \* \* \*